(12) United States Patent
Diehl et al.

(10) Patent No.: US 7,279,901 B2
(45) Date of Patent: Oct. 9, 2007

(54) MAGNETIC RESONANCE APPARATUS AND OPERATING METHOD FOR GENERATING A HOMOGENOUS RF FIELD IN THE EXAMINATION VOLUME

(75) Inventors: Dirk Diehl, Erlangen (DE); Wolfgang Renz, Erlangen (DE); Ulrich Weinert, Herzogenaurach (DE)

(73) Assignee: Siemens Aktiengesellschaft, Munich (DE)

( * ) Notice: Subject to any disclaimer, the term of this patent is extended or adjusted under 35 U.S.C. 154(b) by 323 days.

(21) Appl. No.: 10/974,408

(22) Filed: Oct. 27, 2004

(65) Prior Publication Data

US 2005/0272998 A1    Dec. 8, 2005

(30) Foreign Application Priority Data

Oct. 27, 2003    (DE) ................. 103 50 069

(51) Int. Cl.
*G01V 3/00*    (2006.01)
(52) U.S. Cl. .................. 324/320; 324/307; 324/309
(58) Field of Classification Search ........ 324/300–322; 600/410–435
See application file for complete search history.

(56) References Cited

U.S. PATENT DOCUMENTS

| 5,208,534 | A | * | 5/1993 | Okamoto et al. | ............ | 324/309 |
|---|---|---|---|---|---|---|
| 5,914,599 | A | * | 6/1999 | Sharp | .......................... | 324/318 |
| 6,049,206 | A | * | 4/2000 | Sharp | .......................... | 324/314 |
| 6,249,121 | B1 | | 6/2001 | Boskamp et al. | | |
| 6,252,403 | B1 | | 6/2001 | Alsop | | |
| 6,320,383 | B1 | * | 11/2001 | Kato et al. | .................. | 324/318 |
| 6,720,767 | B2 | * | 4/2004 | Yamazaki | .................... | 324/309 |
| 6,989,673 | B2 | * | 1/2006 | Zhu | .......................... | 324/318 |
| 6,995,561 | B2 | * | 2/2006 | Boskamp et al. | ........... | 324/318 |
| 7,053,618 | B2 | * | 5/2006 | Zhu | .......................... | 324/318 |
| 2003/0184293 | A1 | | 10/2003 | Boskamp et al. | | |
| 2004/0155656 | A1 | | 8/2004 | Leussler | | |

* cited by examiner

*Primary Examiner*—Brij Shrivastav
*Assistant Examiner*—Dixomara Vargas
(74) *Attorney, Agent, or Firm*—Schiff Hardin LLP

(57) ABSTRACT

In a method and magnetic resonance system for generating a homogenous, radio-frequency excitation field in a spatial examination volume of the magnetic resonance system for a subject examination, the magnetic resonance system having a body coil comprised of N resonator segments or groups and a control and evaluation device for the separate activation of the individual resonator segments electromagnetically decoupled from one another, separate excitation of each individual resonator segment using defined excitation parameters ensue with an examination subject located in the magnetic resonance system and the respective segment-specific or group specific magnetic field distributions in the examination volume are determined. The segment-specific or group-specific magnetic field distributions are computationally superimposed to determine a overall field distribution in the examination volume. The homogeneity of the overall field distribution is evaluated using an evaluation algorithm and a change of one or more excitation parameters of one or more resonator segments or segment groups to compensate for a known field inhomogeneity is determined. The resonator segments or segment groups are excited with the determined parameter change to acquire an a diagnostic image of the subject.

13 Claims, 3 Drawing Sheets

MAGNETIC RESONANCE APPARATUS AND OPERATING METHOD FOR GENERATING A HOMOGENOUS RF FIELD IN THE EXAMINATION VOLUME

BACKGROUND OF THE INVENTION

1. Field of the Invention

The present invention concerns a method to generate a homogenous radio-frequency field in a spatial examination volume of a magnetic resonance system for the examination of a subject wherein the magnetic resonance system has a body coil (composed of a number of resonator segments with conductor elements arranged around the examination volume, parallel to the longitudinal axis of a base field magnet) and a control and evaluation device to separately control the individual resonator segments electromagnetically decoupled from one another.

2. Description of the Prior Art

Magnetic resonance tomography are imaging methods for medical diagnostics that uses the interaction of an external field (here a magnetic field) with the human body for imaging. The general design and the functioning of such a magnetic resonance system are known and need not be described in detail herein.

Magnetic resonance systems have been conventionally used in which the basic magnetic field is more than 1.5 T, in particular 3 T and more. Better resolutions are achievable with these magnetic resonance systems, but additional inhomogeneities of the image quality occur in such conventional systems that are traced back to inhomogeneities in the excitation field generated by the body coil.

It is known from U.S. Pat. No. 6,252,403 to fashion the transmission antenna in the shape of a spiral in order to compensate for radio-frequency eddy currents that lead to inhomogeneities. The transmission antenna thus assumes the appearance of a birdcage resonator wound around a symmetry axis. From this document, it is also known to arrange suitable dielectrics, in particular water, in proximity to the examination subject in order to hereby achieve a homogenization of the radio-frequency excitation field. Despite these features a sufficient compensation of the inhomogeneities in the body coil excitation field is not possible in all cases.

Furthermore, from European Application 1 279 968, discloses a magnetic resonance system in which resolution segments that are electromagnetically decoupled from one another and that form a body coil are provided according to the system design previously specified. Here the individual resolution segments can oscillate at the desired resolution frequency independently of one another. A separate transmission channel is associated with each resonator segment, meaning that each resonator segment can be separately activated, enabling the generation of separate individual fields that collectively produce a circularly polarized radio-frequency field. The amplitude and the phase of each transmission channel can be individually set.

SUMMARY OF THE INVENTION

In a magnetic resonance system known of the type from European Application 1 279 968 an object of the present invention is to provide a method that allows an optimal control of the individual resonator segments with regard to the generation of a homogenous radio-frequency magnetic field in the examination volume.

This object is achieved in accordance with the invention by a method wherein N resonators of a magnetic resonance body coil of are excited individually or group-by-group to generate N linearly independent magnetic field distributions in the examination volume using defined excitation parameters, with an examination subject located in the magnetic resonance system and the magnetic field distributions in the examination volume are determined.

The body coil is composed of a number of resonator segments, and thus a "resonator" as used herein can be an individual segment or a group of segments. The acquired magnetic field distributions to determine an overall field distribution in the examination volume.

The homogeneity of the overall field distribution is evaluated using an evaluation algorithm and a change of one or more excitation parameters of one or more resonator segments or segment groups is determined to compensate for a known field inhomogeneity. The resonator segments or segment groups are excited dependent on the determined parameter change, to acquire an examination image of the examination subject.

Naturally, a repetition of the steps of the calculated superimposition, the homogeneity evaluation and the determination of modification parameters can be executed (iterative optimization).

In the inventive method the individual N resonator segments N are excited separately or combined into predetermined groups and time-delayed in sequence with defined or normalized excitation parameters, which if necessary can be the same for all resonator segments, in order to achieve a system of N individual linearly independent magnetic field distributions in the examination volume. This means that the number of possible magnetic field distributions that are inventively determined (i.e., N distributions) is established by the number of resonator segments. These linearly independent magnetic field distributions are therefore can be designated as "segment-specific" magnetic field distributions. The respective excitation ensues at the resonance frequency of the MR system, for example with a normal current of an amplitude of 1 A and an arbitrary phase of, for example, 0°.

After the N (all possible linearly independent) magnetic field distributions have been determined, a calculated superimposition of the acquired (segment-specific or segment-group-specific) magnetic field distributions ensues in the control and evaluation device to determine the total magnetic field distribution in the examination volume. The overall field in the examination volume thus is determined by superimposing of the individual fields. If the overall field distribution is known, it is evaluated with regard to its homogeneity, meaning the control and evaluation device checks whether the overall field or the overall field distribution in the examination volume is homogenous at all locations or at least, fulfills one or more homogeneity criteria, or whether a locally or globally (meaning over the entire examination volume) existing field inhomogeneity exist. For this purpose, the inventive method uses an evaluation algorithm that analyzes the overall field distribution on the basis of existing (known) information regarding the overall field distribution.

Given the presence of an inhomogeneity, the evaluation algorithm also supplies the necessary information in order to determine how this can be compensated by modification of the excitation parameters of one or more of the resonator segments. This means that the evaluation algorithm is part of an optimization algorithm to determine the parameter changes that are necessary (during activation) to modify one or more individual fields in order to compensate the determined inhomogeneity. The excitation of the resonator segments to generate the circularly polarized magnetic field components with maximum homogeneity then ensues based on this modified set of excitation parameters.

The inventive method consequently allows, in a simple and rapid manner, the generation of an excitation field with maximum homogeneity in the examination volume. Only a complete sampling under separate or group-by-group, time-delayed activation of all resonator segments for the acquisition of the individual fields is necessary to achieve this result. A diagnostic patient exposure is not produced during this optimization procedure; rather, the parameters necessary for a significant image acquisition are determined in a simpler and faster manner for the subsequent diagnostic image acquisition. After the evaluation algorithm for the optimization of the homogeneity of the excitation field, the image acquisition can ensue on the basis of an optimally homogenous excitation field, such that a maximum information yield is possible without inhomogeneities of the image quality.

In an embodiment of the inventive method, an excitation-specific magnetic resonance image is acquired to determine each linearly independent excitation (RF) field distribution, and this magnetic resonance image is used to reconstruct the field curve or pattern. According to this embodiment, the associated magnetic resonance image is acquired from the examination volume to determine the segment-specific field distribution at each segment excitation. The radio-frequency field distribution, known as the B1 field distribution, can now be reconstructed from this image dependent on the segment excitation, and this reconstruction result is subsequently used in the determination of the overall field distribution.

As an alternative to the determination of the overall field distribution in the examination volume on the basis of an actual segment excitation, and in particular as an alternative to the acquisition of actual MR images to determine the individual magnetic fields, in another embodiment the overall field distribution is determined based on a simulation without involving the examination subject, in order to effect the homogeneity optimization based on this overall field distribution. In this embodiment of the inventive method for the generation of a homogenous radio-frequency magnetic field, N resulting linearly independent magnetic field distributions for the individual resonator segments are simulated by the control and evaluation device for separate or group-by-group excitation of the resonator segments with defined excitation parameters, using a simulation model of the magnetic resonance system and the examination subject. The simulated magnetic field distributions are computationally superimposed to determine a simulated overall field distribution in the examination volume. The homogeneity of the simulated overall field distribution is evaluated using an evaluation algorithm and modification of one or more of the excitation parameters of one or more resonator segments is determined, with the excitation parameters forming the basis of the simulation, to compensate a known established field inhomogeneity. The resonator segments or resonator segment groups under consideration are excited using the determined parameter modification for the acquisition of an examination image of the examination subject.

An iterative optimization of this embodiment of the inventive method is also possible.

In this latter inventive alternative, a single field simulation is used instead of the actual individual field generation as in the previously specified embodiment. For this purpose, a simulation model of the magnetic resonance system as well as of the examination subject are provided on the side of the control and evaluation device. The simulation model of the examination subject should optimally correspond to the actual subject who is to be subsequently examined, meaning this subject model should optimally correspond to the actual examination subject with regard to tissue and bone structure or the tissue and bone distribution in the examination volume. Based on this digitized human model or phantom, a simulation of the resulting individual magnetic field distributions in the examination volume with a simulated separate resonator segment excitation now ensues using the simulation model of the magnetic resonance system, also based on defined or normalized excitation parameters. Simulated individual magnetic fields are obtained therefrom this that subsequently (corresponding to the actual distributions acquired in the other embodiment) form the basis of the calculated superposition to generate the total magnetic field distribution. If this is known from the simulation, its evaluation ensues here as well in the evaluation algorithm for the determination of possible field inhomogeneities as well as possible parameter changes necessary for the compensation thereof. As soon as the parameter set for the activation of all resonator segments for an optimally homogenous excitation field is known, the diagnostic examination of the examination subject with actual magnetic resonance data acquisition can ensue.

In the assessment of the homogeneity of the overall field distribution by the evaluation algorithm, one or more limit values for the locally specific absorption rate of the examination subject can be taken into account. A limit value for the globally specific absorption rate in the examination subject can likewise be taken into account. This is based on the fact that, given a strong basic magnetic field of, for example, 3 T, very high frequencies of the excitation field must be used, for example 128 MHz given a 3 T base magnetic field. Due to the high frequency and the low penetration depth associated thereafter, severe inhomogeneities result that lead to the spin flip throughout the exam volume being insufficient. In addition, a significant heating of the body based on the high energy application results. This increased energy application cannot be arbitrarily high locally with regard to the examination volume, nor globally with regard to the overall examination subject, limit values must be considered within the framework of the MR examination in order to avoid RF overexposure of the patient. The local specific absorption rate (SAR) the local energy application per unit of weight and is defined as a dissipation loss per kilogram of weight, while the global absorption rate represents the total dissipation loss with regard to the total weight of the examination subject. For example, the global absorption rate can be below the limit value while the local absorption rate at a specific point of the examination volume can exceed the limit value, and can lead to a local overheating of the patient.

In order to counteract this, in an embodiment of the invention the evaluation algorithm takes into account one or more predetermined limit values with regard to the local and/or the global absorption rate in order to ensure that the determined excitation parameters are such that neither a local nor a global absorption rate is exceeded. Not only does the optimization of the excitation parameters ensue with regard to a homogeneity of the excitation field over the entire examination volume, but also at the same time an optimization of the excitation parameters is also effected that prevents local and/or global limit values of the absorption rate in the entire examination subject, thus also extending over the examination volume, from being exceeded. An excitation parameter set ultimately results that is optimized both with regard to the field inhomogeneity as well as with regard to adhering to the absorption or energy application rate.

The assessment of the homogeneity of the overall field distribution can ensue using the amplitudes and phases of the linearly independent excitation field distributions, identical to the manner in which these field distributions are determined. The evaluation algorithm realized as software assumes the numerical values for amplitudes and phases of the measured or simulated fields that occur given the excitation of only one resonator segment, or only one segment group. On the basis of these values, it is subsequently determined with which amplitudes and phases the individual resonator segments or segment groups must be activated in order to compensate for the inhomogeneity in the examination volume determined in this manner, to achieve a maximum homogeneity of the circularly polarized magnetic field components.

In the context of this assessment and determination, the amplitudes and phases can be considered in different manners, but always with the goal to compensate the inhomogeneities. This can ensue, for example, using the integral (normalized by the square of the field intensity) of the quadratic deviation of the field intensity from its average value. It is thus assessed how large the deviation of the individual segment-specific amplitudes and phases are from their average values. The integral extends over the three-dimensional examination volume that can be defined interactively. The numerical solution itself can be attained, for example, using the conjugated gradient method. This evaluation mode is, however, only one of many examples as to how the field homogeneity assessment and the determination of the excitation parameters to be changed can ensue.

The activation of the individual activation terminals of the segments or of the segment groups is now realized according to the measure of the numerical results of the optimization algorithm in the form of the amplitudes and phases with which the individual resonator segments or segment groups are to be activated. The inputs or activation terminals can be controlled, for example, by means of power splitters and phase shifters. As an alternative, a regulated amplifier can be used for each individual excitation terminal.

In addition to the inventive method, the above object is also achieved in accordance with the invention by a magnetic resonance system with a control and evaluation device that implements a method as described above.

DESCRIPTION OF THE PREFERRED EMBODIMENTS

Figure 1:
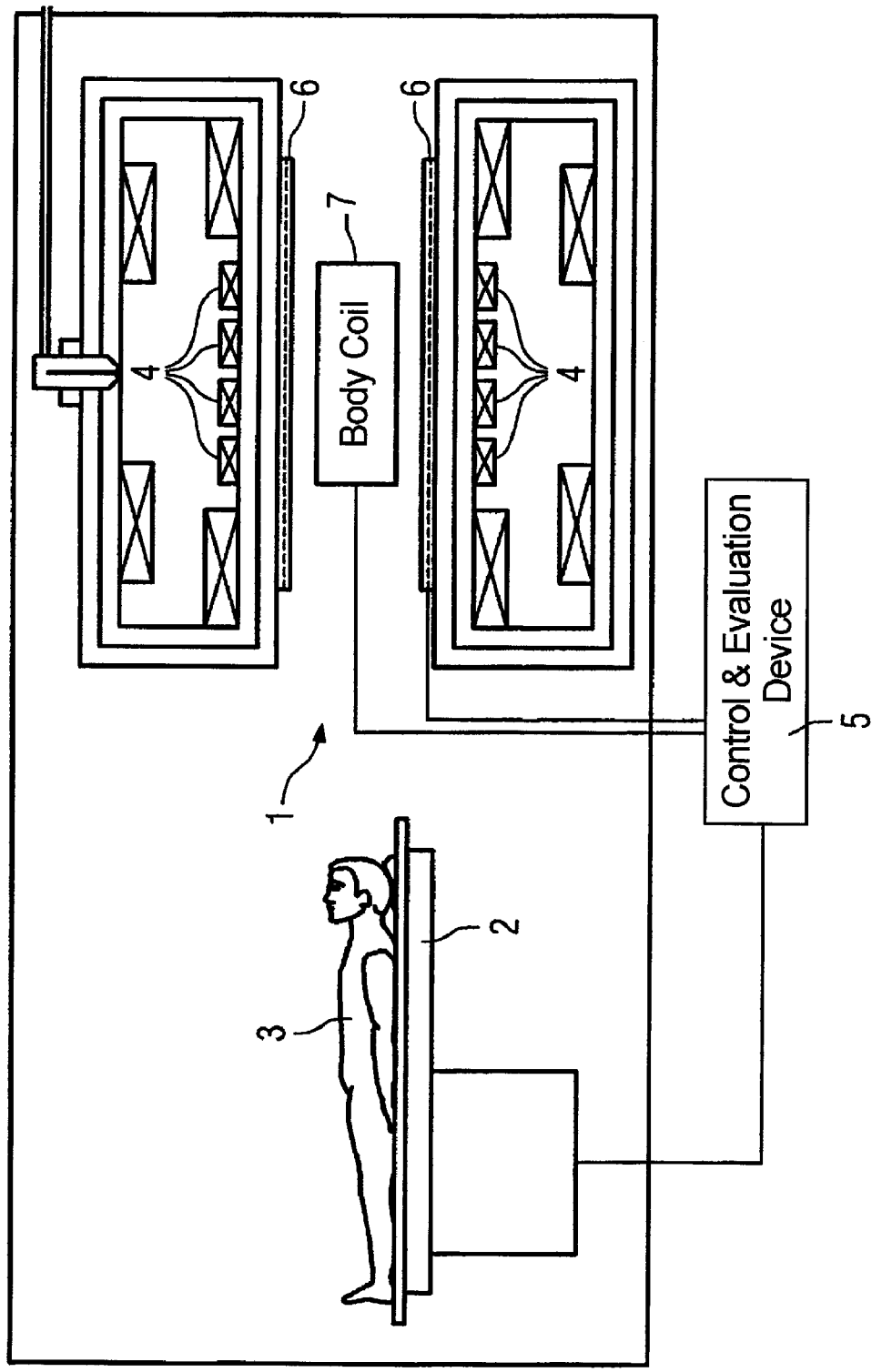
FIG. 1 is a schematic illustration of a magnetic resonance system operable in accordance with the invention.

FIG. 1 shows an inventive magnetic resonance (MR) system that has an examination region 1 into which an examination subject 3, here a person, can be introduced into by a patient bed 2. The examination region 1 (which corresponds to the examination volume) is permeated by a basic magnetic field generated by a basic field magnet 4. The base magnetic field is temporally constant (static) and spatially as homogenous as possible. It exhibits a magnetic flux density of preferably 3 T or more.

The basic field magnet 4 is preferably a superconducting magnet system. Thus no further activations are necessary by a control and evaluation device 5, with which the overall system operation is controlled.

The magnetic resonance system also has a gradient system 6 by means of which the examination region 1 can be exposed to gradient magnetic fields. The gradient system 6 can be activated by the control and evaluation device 5, such that gradient currents flow in the gradient system 6.

The magnetic resonance system also has a body coil 7 that normally serves a double function. It serves as a transmission antenna for excitation field generation and as a reception antenna for the acquisition of MR signals. The body coil 7 can be activated by the control and evaluation device 5, such that corresponding excitation currents flow therein according to the excitation parameters that are set in the control and evaluation device 5.

The examination region 1, thus the examination volume, can be exposed to a radio-frequency excitation field by means of the body coil 7. In the event that the examination subject 3 is introduced into the examination region 1, this examination subject 3 thus can be excited to magnetic resonance. In the shown system example, the magnetic resonance signals thereby generated are then acquired via the body coil 7, which then operates as a reception antenna. The acquired magnetic resonance signals are supplied to the control and evaluation device 5 and are evaluated therein to generate the magnetic resonance image that is output to a monitor (not shown in detail).

The quality of the magnetic resonance images depends on, among other things, the homogeneity of the excitation field generated by the body coil 7. In order to be able to generate an optimal (with regard to homogeneity) excitation field, the individual resonator segments or segment groups 8 of the body coil 7 can be activated individually, meaning each resonator segment or each segment group can be controlled separately from any other for field generation.

Figure 2:
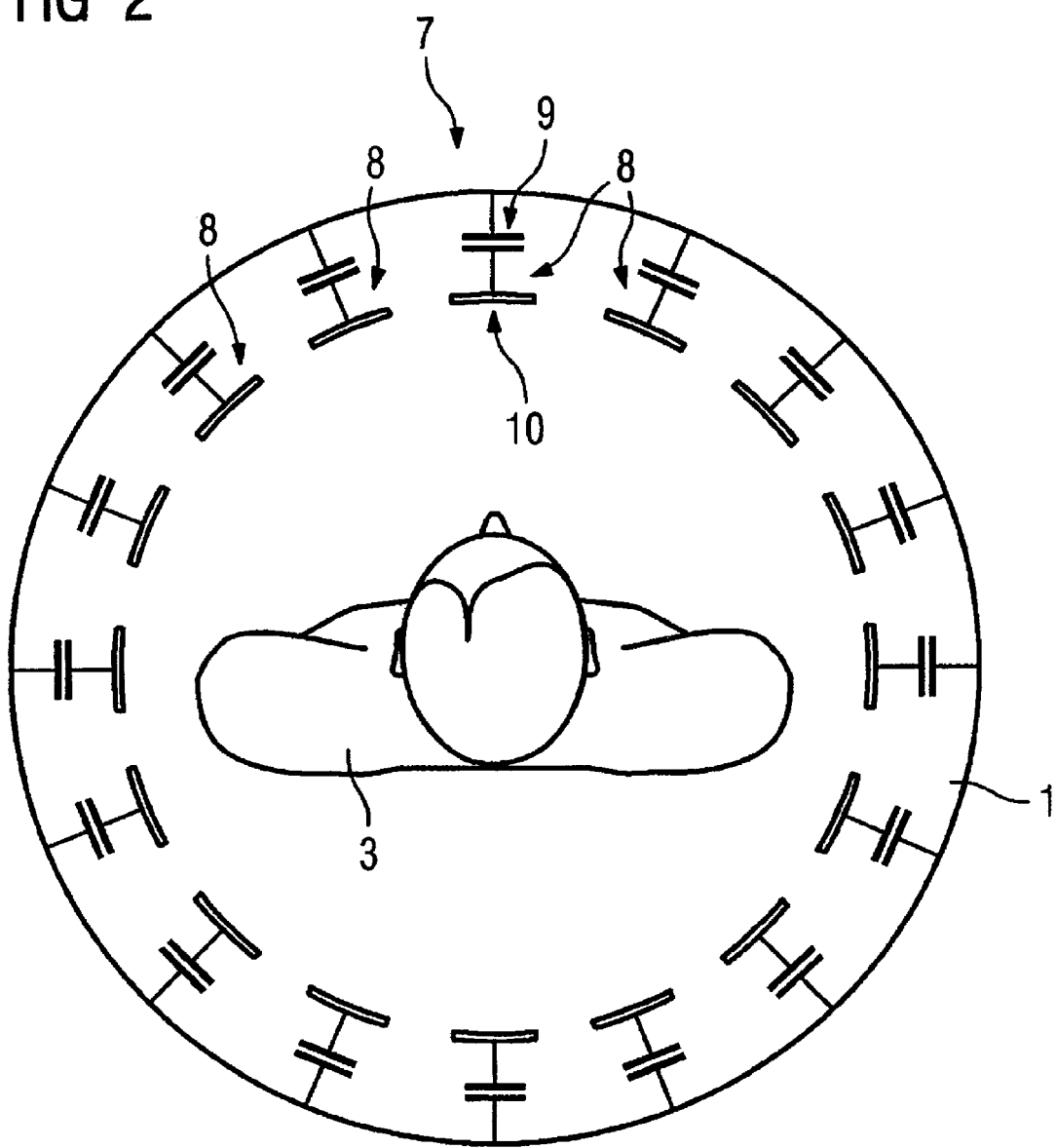
FIG. 2 is a schematic illustration of a section through a body coil of the type used in accordance with the invention.

As shown in FIG. 2, a body coil 7 is formed by a number of individual resonator segments, in the shown exemplary embodiment the body coil 7 is composed of sixteen resonator segments 8. Each resonator segment has of at least one capacitor 9 as well as a conductor element 10 that, for example, runs parallel to the longitudinal axis of the basic field magnet 4. A conductor element is suitably fashioned as a ribbon or strip conductor. The resonator segments 8 are arranged such that they surround the examination region 1, thus the examination volume. To allow that the resonator segments or segment groups 8 to be separately activated, it is necessary to electromagnetically decouple them from one another. This can ensue in different ways, for example, as described in 1 279 968 A2 is wherein various decoupling, possibilities are specified that are suitable for use in the inventive magnetic resonance system (not specified in detail here).

Figure 3:
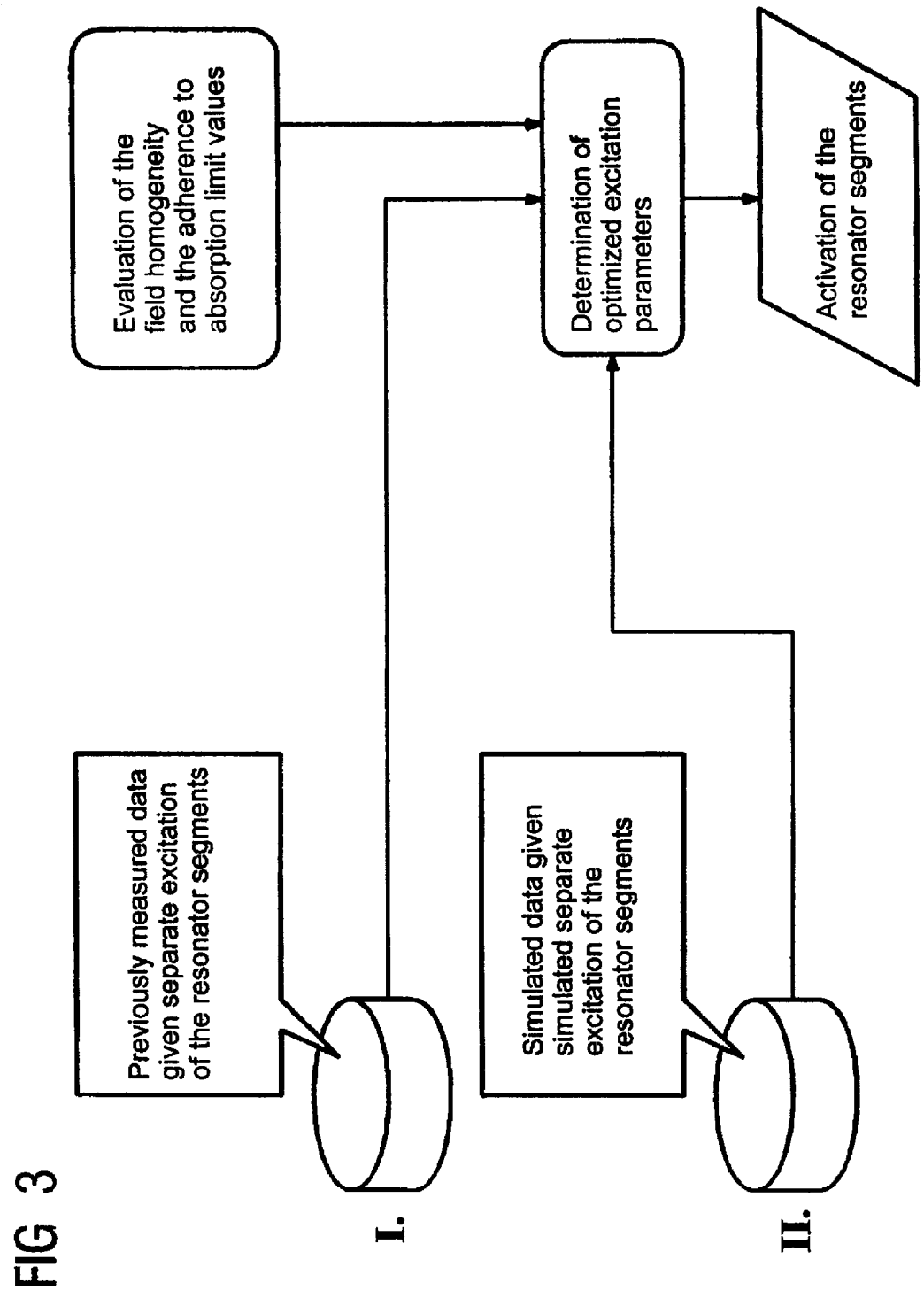
FIG. 3 is a flow chart for determining the optimized excitation parameters in accordance with the invention.

FIG. 3 now shows a basic flow diagram as to how optimized excitation parameters can be achieved in accordance with the invention. As shown under I, the possibility exists, according to a first method embodiment, to first activate each resonator segment or each segment group (controlled by the control and evaluation device 5) separately with normalized activation parameters, for example a normal current at the MR frequency with an amplitude of 1 A and a phase of 0°. After switching to the reception mode MR signals are acquired via the body coil 7 respectively a two-dimensional magnetic resonance image resulting from the activation by each resonator segment or each segment group. After this has ensued for all resonator segments or segment groups 8, based on an evaluation and optimization algorithm the control and evaluation device 5 determines the respective segment-specific (or group-specific) individual magnetic distributions for each individual excitation. The evaluation and optimization algorithm, which is realized as software, records the numerical values of the amplitudes and phases of the fields occurring given the excitation of only one individual resonator segment, or one segment group, which ensues by analysis of the individual magnetic resonance images and reconstruction of the individual fields. At the same time, it can offer the user the possibility to interactively define (in dimension and shape) the spatial examination volume to be examined. After the individual fields are determined, the overall field distribution in the examination volume (that, if applicable, the user has defined) is computationally determined by superimposing the individual field distributions. The evaluation algorithm with which this is executed considers corresponding evaluation criteria with which the homogeneity can be determined. For example, this can ensue based on deviations of the amplitudes or phases of the individual fields from standard (reference) values or the like. Corresponding evaluation possibilities have been described above. At the same time, the assessment of the overall field distribution ensues in parallel to the homogeneity determination based on one or more limit values that define the local and/or global absorption rates that cannot be exceeded. The goal of the evaluation is to optimize the excitation parameter of each individual resonator segment 8, such that on the one hand a homogenous field is generated in the examination volume, while not exceeding the absorption limit values.

If the parameter set for the activation of the individual resonator segments or groups has now been determined, the segments or groups can be activated with these parameters to generate a circularly polarized magnetic field with optimal homogeneity and simultaneous adherence to the local/global absorption limit values.

An alternative to actual individual segment excitation is designated II. The individual fields resulting from a possible individual segment excitation are simulated. For this purpose, suitable simulation models, both for the magnetic resonance system and for an examination subject 3 that should form the basis of the examination, are used by the control and evaluation device 5. The simulation data optimally correspond to the actual subject 3 to be examined next, so that the parameter determination can ensue optimally close to the actual examination situation.

After the individual excitation field distributions have been determined here based on normalized excitation parameters, the resulting total magnetic field is likewise determined by superimposing the individual fields. Subsequently, the existence of possible field inhomogeneities is checked for using the evaluation algorithm and the final set of excitation parameters to be adjusted for the optimized field generation is determined.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for generating a homogenous radio frequency field in a three-dimensional examination volume of a magnetic resonance system, said magnetic resonance system comprising a radio frequency body coil comprised of a plurality of resonator segments, and a control and evaluation device connected to the body coil for separately activating respective resonators of said body coil electromagnetically decoupled from each other, said resonators being selected from the group consisting of individual resonator segments and groups of said resonator segments, comprising the steps of:

exciting N resonators of said body coil, with an examination subject disposed in said examination volume, to generate N linearly independent radio frequency field distributions in said examination volume using defined excitation parameters, each of said N field distributions being produced by one of the N excited resonators and, with said body coil, acquiring the respective radio frequency field distributions arising from said excitation in said examination volume;

computationally superimposing the acquired radio frequency field distributions in said control and evaluation device and determining therein an overall field distribution in said examination volume, said overall field distribution having a homogeneity associated therewith;

in said control and evaluation device, computationally evaluating the homogeneity of said overall field distribution using an evaluation algorithm, and determining a change of at least one of said defined excitation parameters for at least one of said resonators to compensate for a known inhomogeneity of said overall radio frequency field; and modifying said defined excitation parameters dependent on said parameter change and exciting said N resonators, with said examination subject in said examination volume, with the modified excitation parameters to acquire diagnostic magnetic resonance data from said examination subject making said diagnostic magnetic resonance data available in a form allowing reconstruction of an image.

2. A method as claimed in claim 1 comprising sequentially separately exciting said N resonators of said body coil using said defined excitation parameters.

3. A method as claimed in claim 1 comprising separately exciting each of said N resonators and, for each resonator excitation, acquiring an excitation-specific magnetic resonance image of said examination subject, and determining the radio frequency field distribution arising from that resonator excitation from the excitation-specific magnetic resonance image.

4. A method as claimed in claim 1 comprising evaluating said homogeneity of said overall radio frequency field distribution dependent in part on a global radio frequency absorption rate of said examination subject.

5. A method as claimed in claim 1 wherein each of said radio frequency field distributions has an amplitude and phase associated therewith, and comprising evaluating the homogeneity of the overall field distribution from the respective amplitudes and phases of the linearly independent radio frequency field distributions.

6. A method as claimed in claim 1 comprising evaluating said homogeneity of said overall radio-frequency field distribution dependent in part on a local radio-frequency absorption rate of said examination subject.

7. A method for generating a homogenous radio frequency field in a three-dimensional examination volume of a magnetic resonance system, said magnetic resonance system comprising a radio frequency body coil comprised of a plurality of resonator segments, and a control and evaluation device connected to the body coil for separately activating respective resonators of said body coil electromagnetically decoupled from each other, said resonators being selected from the group consisting of individual resonator segments and groups of said resonator segments, comprising the steps of:

software simulating excitation N resonators of said body coil, while software simulating an examination subject disposed in said examination volume, to generate N linearly independent radio frequency simulated field distributions in said examination volume using defined excitation parameters, each of said simulated field distributions being simulated as produced by simulated excitation of one of said N resonators;

computationally superimposing the simulated radio frequency field distributions in said control and evaluation device and determining therein an overall radio frequency simulated field distribution in said examination volume, said overall simulated field distribution having a homogeneity associated therewith;

in said control and evaluation device, computationally evaluating the homogeneity of said overall simulated field distribution using an evaluation algorithm, and determining a change of at least one of said defined excitation parameters for at least one of said resonators to compensate for a known inhomogeneity of said overall simulated field distribution; and modifying said defined excitation parameters dependent on said parameter change and exciting said N resonators, with said examination subject in said examination volume, with the modified excitation parameters to acquire diagnostic magnetic resonance data from said examination subject making said diagnostic magnetic resonance data available in a form allowing reconstruction of an image.

8. A method as claimed in claim 7 comprising simulating the radio frequency field distributions of the respective resonators by simulating a sequentially separate excitation of the respective resonators with said defined excitation parameters.

9. A method as claimed in claim 7 comprising evaluating the homogeneity of the overall radio frequency field distribution in said evaluation algorithm dependent on at least one limit value for a local radio frequency absorption rate of the examination subject.

10. A method as claimed in claim 7 comprising evaluating the homogeneity of the overall radio frequency field distribution in said evaluation algorithm dependent in part on at least one limit value for a global radio frequency energy absorption rate of said examination subject.

11. A method as claimed in claim 7 wherein each of said radio frequency field distributions has an amplitude and phase associated therewith, and comprising evaluating the homogeneity of the overall field distribution from the respective amplitudes and phases of the linearly independent radio frequency field distributions.

12. A magnetic resonance system comprising:

a basic field magnet for generating a homogenous basic magnetic field in a three-dimensional examination volume;

a radio frequency body coil comprised of a plurality of resonator segments;

a control and evaluation device connected to the body coil for separately activating respective resonators of said body coil electromagnetically decoupled from each other, said resonators being selected from the group consisting of individual resonator segments and groups of said resonator segments;

said control and evaluation device exciting N resonators of said body coil, with an examination subject disposed in said examination volume, to generate N linearly independent radio frequency field distributions in said examination volume using defined excitation parameters, each of said N field distributions being produced by one of the N excited resonators and, with said body coil, acquiring respective radio frequency field distributions arising from said excitation in said examination volume, said control and evaluation device computationally superimposing the acquired radio frequency field distributions and determining an overall radio frequency field distribution in said examination volume, said overall field distribution having a homogeneity associated therewith, and said control and evaluation device computationally evaluating the homogeneity of said overall radio frequency field distribution using an evaluation algorithm, and determining a change of at least one of said defined excitation parameters for at least one of said resonators to compensate for a known inhomogeneity of said overall radio frequency field; and said control and evaluation device modifying said defined excitation parameters dependent on said parameter change and exciting said N resonators, with said examination subject in said examination volume, with the modified excitation parameters to acquire diagnostic magnetic resonance data from said examination subject.

13. A magnetic resonance apparatus comprising:

a basic filed magnet for generating a homogenous field in a three-dimensional examination volume;

a radio frequency body coil comprised of a plurality of resonator segments;

a control and evaluation device connected to the body coil for separately activating respective resonators of said body coil electromagnetically decoupled from each other, said resonators being selected from the group consisting of individual resonator segments and groups of said resonator segments;

said evaluation and control device having software loaded therein for software simulating excitation N resonators of said body coil, while software simulating an examination subject disposed in said examination volume, to generate N linearly independent radio frequency simulated field distributions in said examination volume using defined excitation parameters, each of said simulated field distributions being simulated as produced by simulated excitation of one of said N resonators;, and for computationally superimposing the simulated radio frequency field distributions and determining therein an overall radio frequency simulated field distribution in said examination volume, said overall simulated field distribution having a homogeneity associated therewith, and for evaluating the homogeneity of said overall simulated field distribution using an evaluation algorithm, and computationally determining a change of at least one of said defined excitation parameters for at least one of said resonators to compensate for a known in homogeneity of said overall simulated field distribution; and said control and evaluation device modifying said defined excitation parameters dependent on said parameter change and exciting said N resonators, with said examination subject in said examination volume, with the modified excitation parameters to acquire diagnostic magnetic resonance data from said examination subject.

* * * * *